(12) United States Patent
Lee et al.

(10) Patent No.: US 7,315,014 B2
(45) Date of Patent: Jan. 1, 2008

(54) IMAGE SENSORS WITH OPTICAL TRENCH

(75) Inventors: Ji Soo Lee, Boise, ID (US); Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 112 days.

(21) Appl. No.: 11/213,780

(22) Filed: Aug. 30, 2005

(65) Prior Publication Data

US 2007/0045513 A1  Mar. 1, 2007

(51) Int. Cl.
*H01L 27/00* (2006.01)
*H01L 31/00* (2006.01)
*H01L 31/062* (2006.01)
*H01L 31/0232* (2006.01)

(52) U.S. Cl. .............. 250/208.1; 250/214.1; 257/291; 257/432

(58) Field of Classification Search ........... 250/208.1, 250/214.1; 257/291, 292, 427, 432, 435; 348/340, 374; 438/296, 424, 427
See application file for complete search history.

(56) References Cited

U.S. PATENT DOCUMENTS

| 6,140,630 | A | 10/2000 | Rhodes |
| 6,204,524 | B1 | 3/2001 | Rhodes |
| 6,310,366 | B1 | 10/2001 | Rhodes et al. |
| 6,326,652 | B1 | 12/2001 | Rhodes |
| 6,333,205 | B1 | 12/2001 | Rhodes |
| 6,376,868 | B1 | 4/2002 | Rhodes |
| 7,112,511 | B2 * | 9/2006 | Hong .................. 438/427 |
| 2005/0263805 | A1 * | 12/2005 | Mouli .................. 257/292 |

OTHER PUBLICATIONS

Nixon et al., "256x256 CMOS Active Pixel Sensor Camera-on-a-Chip," IEEE Journal of Solid-State Circuits, vol. 31(12), pp. 2046-2050 (1996).

Mendis et al., "CMOS Active Pixel Image Sensors," IEEE Transactions on Electron Devices, vol. 41(3), pp. 452-453 (1994).

* cited by examiner

*Primary Examiner*—Georgia Epps
*Assistant Examiner*—Don Williams
(74) *Attorney, Agent, or Firm*—Dickstein Shapiro LLP

(57) ABSTRACT

A device and method for providing an optical trench structure for a pixel which guides incoming light onto the photosensor of the pixel. The optical trench structure has an optically reflecting barrier that substantially mitigates optical crosstalk. The optical trench structure is made of low dielectric constant material with an index of refraction that is less than the index of refraction of the material of surrounding layers (e.g., the substrate). This difference in refractive index causes an internal reflection into an optical path existing between a lens and pixel.

37 Claims, 8 Drawing Sheets

IMAGE SENSORS WITH OPTICAL TRENCH

FIELD OF THE INVENTION

The invention relates generally to solid state imaging devices and more particularly to a method and structure for optically isolating pixel regions to reduce optical crosstalk in a solid state image sensor.

BACKGROUND OF THE INVENTION

There are a number of different types of semiconductor-based imagers, including charge coupled devices (CCD's), photodiode arrays, charge injection devices (CID's), hybrid focal plane arrays, and complementary metal oxide semiconductor (CMOS) imagers. Current applications of solid-state imagers include cameras, scanners, machine vision systems, vehicle navigation systems, video telephones, computer input devices, surveillance systems, auto focus systems, star trackers, motion detector systems, image stabilization systems, and other image acquisition and processing systems.

CMOS imagers are well known. CMOS images are discussed, for example, in Nixon et al., "256×256 CMOS Active Pixel Sensor Camera-on-a-Chip," IEEE Journal of Solid-State Circuits, Vol. 31(12), pp. 2046-2050 (1996); Mendis et al., "CMOS Active Pixel Image Sensors," IEEE Transactions on Electron Devices, Vol. 41(3), pp. 452-453 (1994); and are also disclosed in U.S. Pat. Nos. 6,140,630, 6,204,524, 6,310,366, 6,326,652, 6,333,205, and 6,326,868; assigned to Micron Technology, Inc., the entire disclosures of which are incorporated herein by reference.

Semiconductor imaging devices include an array of pixels, which converts light energy received, through an optical lens, into electrical signals. Each pixel contains a photosensor for converting a respective portion of a received image into an electrical signal. The electrical signals produced by the array of photosensors are processed to render a digital image.

The amount of charge generated by the photosensor corresponds to the intensity of light impinging on the photosensor. Accordingly, it is important that all of the light directed to the photosensor impinges on the photosensor rather than being reflected or refracted toward another photosensor (known as optical crosstalk).

For example, optical crosstalk may exist between neighboring photosensors in a pixel array. In an ideal imager, a light enters only through the surface of the photosensor that directly receives the light stimulus. In reality, however, some light intended for one photosensor also impinges on another photosensor through the sides of the optical path existing between a lens and the photosensor.

Optical crosstalk can bring about undesirable results in the images produced by the imaging device. The undesirable results can become more pronounced as the density of pixels in the imager array increases, and as pixel size correspondingly decreases. The shrinking pixel sizes make it increasingly difficult to properly focus incoming light on the photosensor of each pixel without accompanying optical crosstalk.

Optical crosstalk can cause a blurring or reduction in contrast in images produced by the imaging device. Optical crosstalk also degrades the spatial resolution, reduces overall sensitivity, causes color mixing, and leads to image noise after color correction. As noted above, image degradation can become more pronounced as pixel and related device sizes are reduced. Furthermore, degradation caused by optical crosstalk is more conspicuous at longer wavelengths of light. Light having longer wavelengths penetrates more deeply into the silicon structure of a pixel, providing more opportunities for the light to be reflected or refracted away from its intended photosensor target.

FIG. 1 illustrates the problem of optical crosstalk in a conventional backside illuminated imager. A conventional backside illuminated imager includes an array of photosensors 220, for example, photodiodes, formed within a substrate 290, a passivation layer 260, a color filter array (CFA) 250 and an array of microlenses 240. Ideally, incoming light 295 should stay within a photosensor optical path 223 when traveling through a microlens 240 to a respective photosensor 220. However, light 295 can be reflected within the respective layers of the imager and at the junctions between these layers. Incoming light 295 can also enter the pixel at different angles, causing the light to be incident on a different photosensor.

Optical crosstalk particularly problematic when it occurs within the substrate itself. This can occur in situations where a substantial amount of light is passing through the substrate 290, for example, in a backside illuminated pixel array or imager. For example, once light has passed the CFA layer 250, even small amounts of crosstalk can distort an image because adjacent pixels rarely filter out the same color. That is, if one portion of the spectrum of the incoming light is especially intense, crosstalk below the CFA layer 250 will redirect filtered light to photosensors 220 designed to measure a different color. Transmission of light through the substrate also suffers from electrical interference which can distort the signal further.

Accordingly, there is a need and desire for an improved apparatus and method for reducing optical crosstalk and related electrical interference in imaging devices. There is also a need to more effectively and accurately increase overall pixel sensitivity and provide improved optical crosstalk immunity without adding complexity to the manufacturing process and/or increasing fabrication costs.

BRIEF SUMMARY OF THE INVENTION

Exemplary embodiments of the invention provide an optical trench structure for a pixel that guides incoming light onto the photosensor of the pixel. The optical trench structure has an optically reflecting barrier that substantially mitigates optical crosstalk. The optical trench structure is made of low dielectric constant material with an index of refraction that is less than the index of refraction of the material of surrounding layers (e.g., the substrate). This difference in refractive index causes an internal reflection into an optical path existing between a lens and pixel.

In other exemplary embodiments, materials with high reflectivity such as metals can be used to implement the optical trench structure. In yet another embodiment, to improve the difference in the index of refraction between the trench structure and the surrounding material, the surrounding layers may be formed with materials having a relatively high index of refraction Other embodiments include a method of forming the optical trench structure in a pixel, and employment of pixels containing the optical trench in imaging and display devices, and in systems including such devices.

BRIEF DESCRIPTION OF THE DRAWINGS

The foregoing and other features of the invention will become more apparent from the detailed description of exemplary embodiments provided below with reference to the accompanying drawings in which.

DETAILED DESCRIPTION OF THE INVENTION

Figure 1:
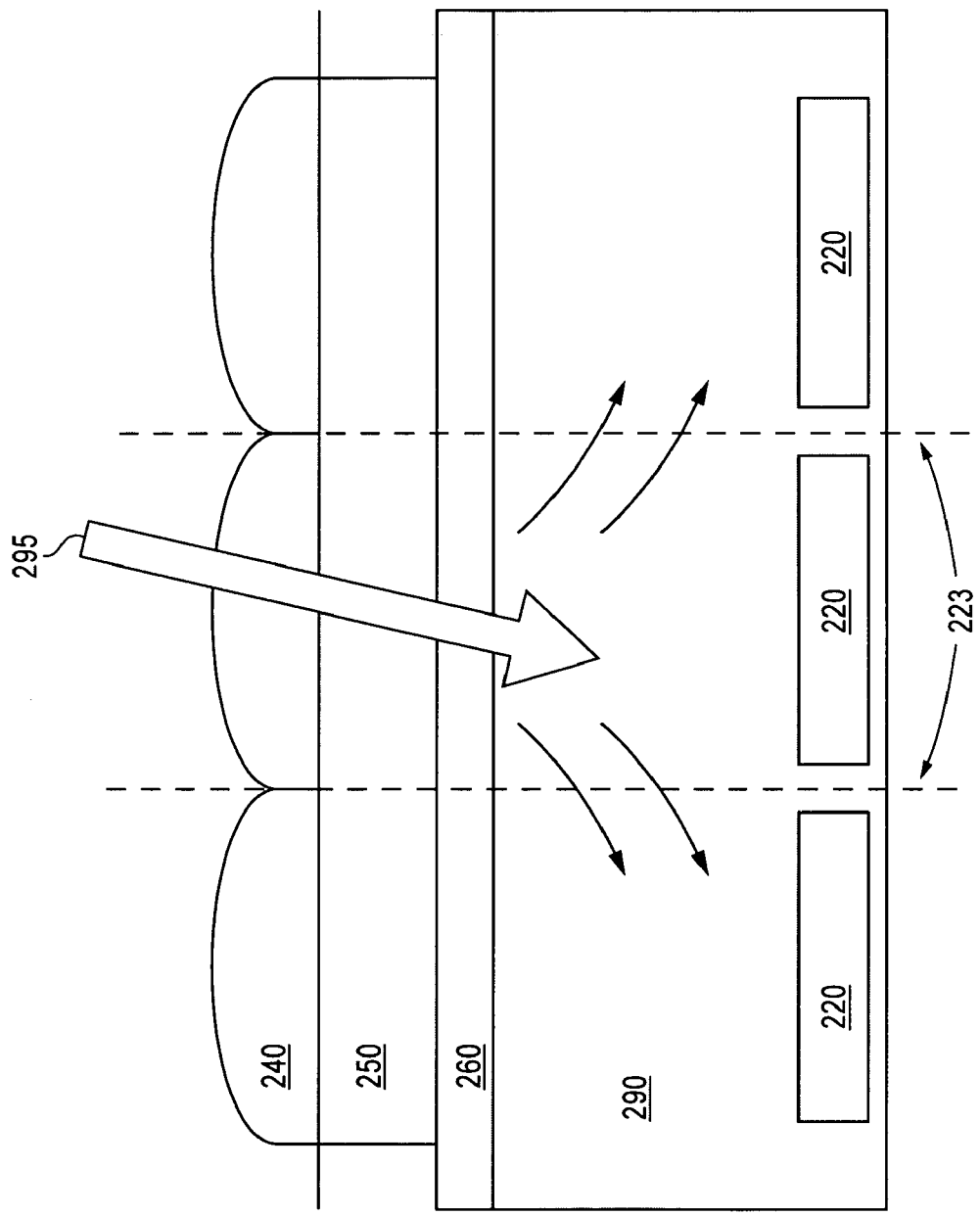
FIG. 1 illustrates a cross sectional view of a prior art pixel array.

In the following detailed description, reference is made to the accompanying drawings which form a part hereof, and in which is shown by way of illustration specific embodiments by which the invention may be practiced. It should be understood that like reference numerals represent like elements throughout the drawings. These exemplary embodiments are described in sufficient detail to enable those skilled in the art to practice the invention. It is to be understood that other embodiments may be utilized, and that structural logical and electrical changes may be made without departing from the spirit and scope of the present invention.

The terms "wafer" and "substrate" are to be understood as including all forms of semiconductor wafers and substrates including silicon, silicon-on-insulator (SOI), silicon-on-sapphire (SOS), doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but could be based on other semiconductors, for example, silicon-germanium, germanium, or gallium arsenide.

The term "pixel" refers to a picture element unit cell containing circuitry including a photosensor and semiconductors for converting electromagnetic radiation to an electrical signal. For purposes of illustration, fabrication of one or more representative pixels is shown and described. Typically, fabrication of all pixels in an imager will proceed simultaneously in a similar fashion.

Although the invention is described herein with reference to the architecture and fabrication of one or a limited number of pixels, it should be understood that this is representative of a plurality of pixels as typically would be arranged in an imager array having pixels arranged, for example, in rows and columns.

In addition, although the invention is described below with reference to a pixel for a CMOS imager, the invention has applicability to other solid-state imaging devices using pixels (e.g., a CCD or other solid state imager).

The invention may also be employed in display devices where a pixel has a light emitter for emitting light. The following detailed description is, therefore, not to be taken in a limiting sense, and the scope of the present invention is defined only by the appended claims.

Figure 2:
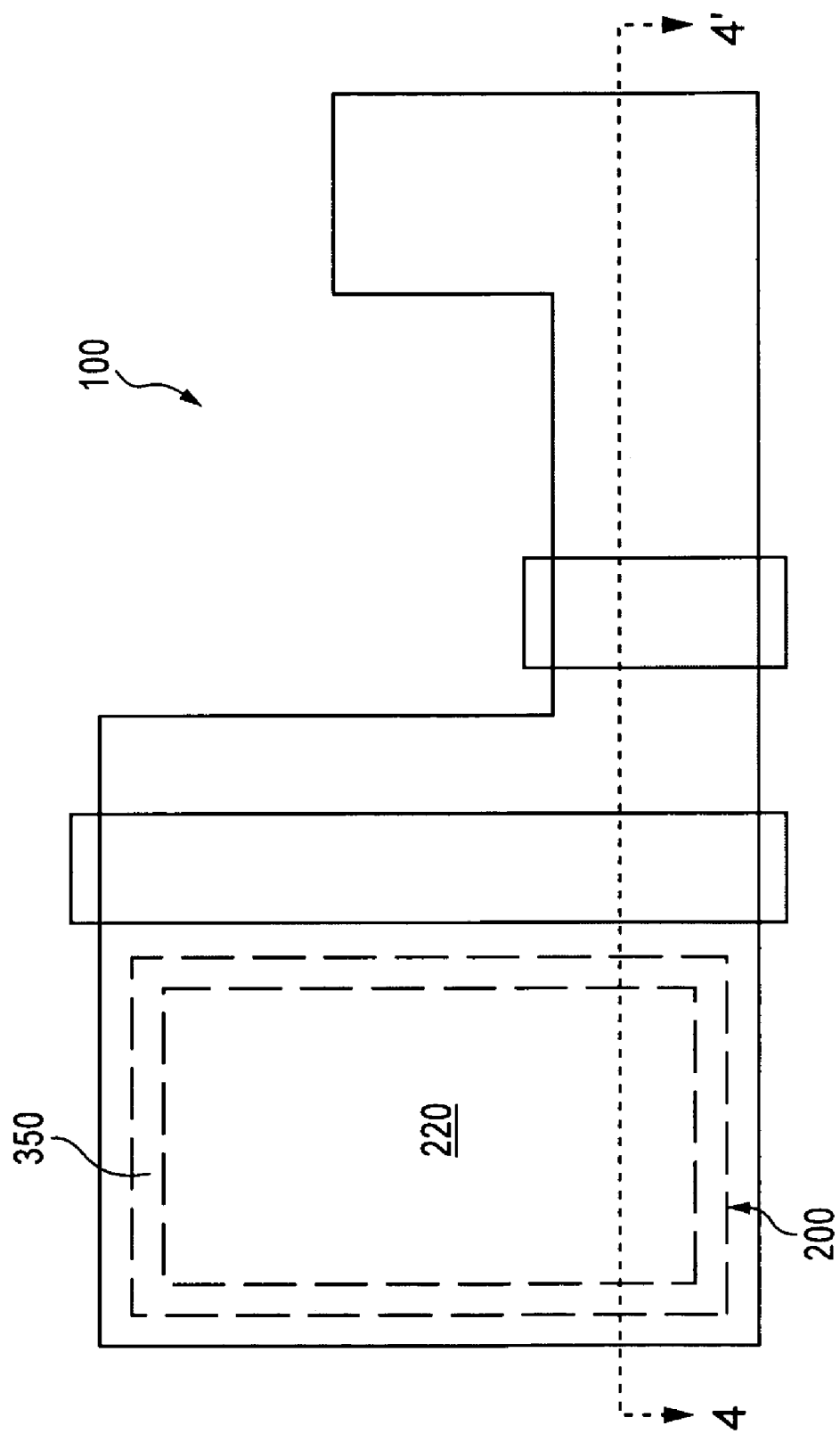
FIG. 2 is a plan view of an image sensor pixel constructed in accordance with an exemplary embodiment of the invention.
Figure 3:
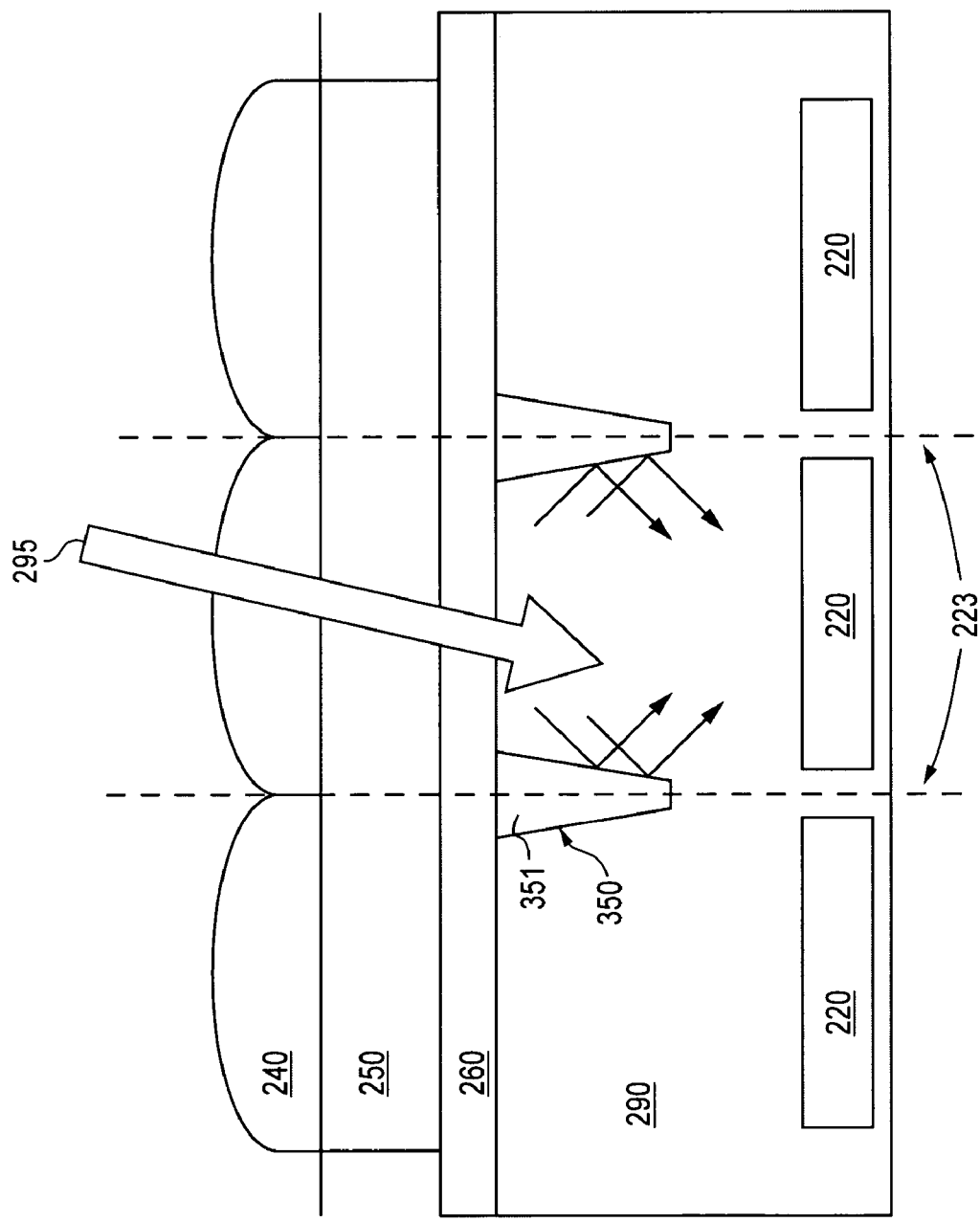
FIG. 3 shows a cross sectional view of an image sensor pixel array containing the FIG. 2 pixels constructed in accordance with the exemplary embodiment of the invention.

Referring to the FIGS. 2 and 3, embodiments of the invention provide a trench 350 within a substrate 290, which is filled with a material 351 designed to provide internal reflection within an optical path 223. The trench 350 and filling material 351 are formed around the optical path 223 in a substrate 290 for each pixel. The trench 350 and associated fill material 351 surround at least a portion of the optical path 223 between a backside illumination source 295 and a corresponding photosensor 220, which corresponds to a lateral area defined by the photosensor 220. The dimensions and location of the filled trench 350 can be tailored depending on the need; the trench 350 may extend from the substrate 290 to or through the color filter array 250. The trench 350 can be etched by any method known in the art.

In a first embodiment of the invention, the fill material 351 is a low-dielectric constant material (low-k material), having a dielectric constant below 1.45 when the substrate is a silicon substrate. More generally, the low dielectric constant material within trench 350 has an index of refraction that is less than the index of refraction of the semiconductor material used for the surrounding substrate 290. The low dielectric constant material may comprise, for example, carbon doped silicon dioxide or fluorinated silica glass oxide or any other material with a lower index of refraction than the substrate 290, for example silicon. In other embodiments of the invention, the fill material 351 may comprise metals having high reflectivity, such as, for example, silver or copper.

Figure 4:
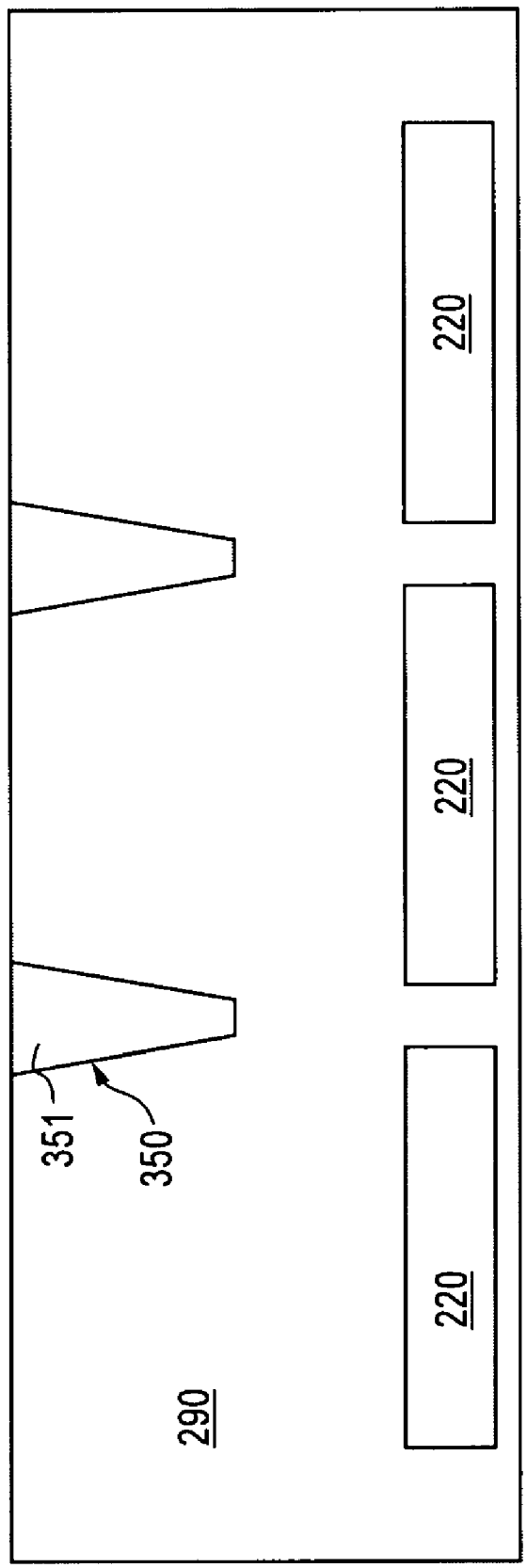
FIG. 4 shows the formation of the optical trench structure of FIG. 3 constructed in accordance with the exemplary embodiment of the invention.

FIG. 4 illustrates the FIG. 3 structure prior to formation of passivation layer 260. In this embodiment, the trench 350 extends into the substrate and not to or around the color filter array 250. The trench 350 may be etched partially into the substrate 290. The trench is then filled with the fill material 351 and planarized by chemical mechanical polishing ("CMP"), after which the passivation layer 260 and additional upper layers are formed thereon. The upper layers may also include, but are not limited to, a BPSG layer, an ILD layer, and an additional passivation layer between the substrate 290 and microlens array 240.

Figure 5:
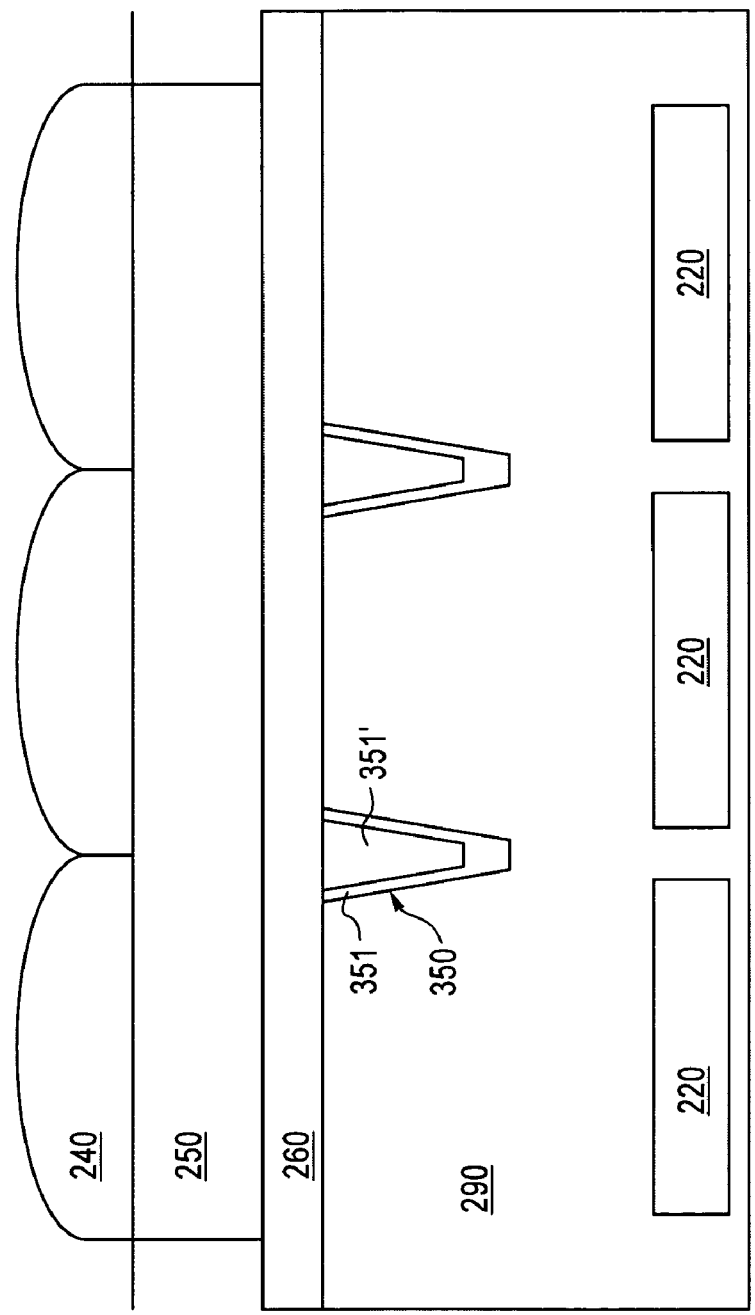
FIG. 5 shows the optical trench structure of FIG. 3 constructed in accordance with another exemplary embodiment of the invention.

FIG. 5 illustrates a modification of the embodiment shown in FIG. 4 in which the trench contains multiple layers of fill material 351, 351'. Two fill material layers 351, 351' deposited sequentially in trench 350 are shown in FIG. 5. These fill materials for layers 351, 351' may include materials having indexes of refraction that differ from the surrounding substrate 290 and from each other, and may include metals having high reflectivity, or any combination thereof.

Figure 6:
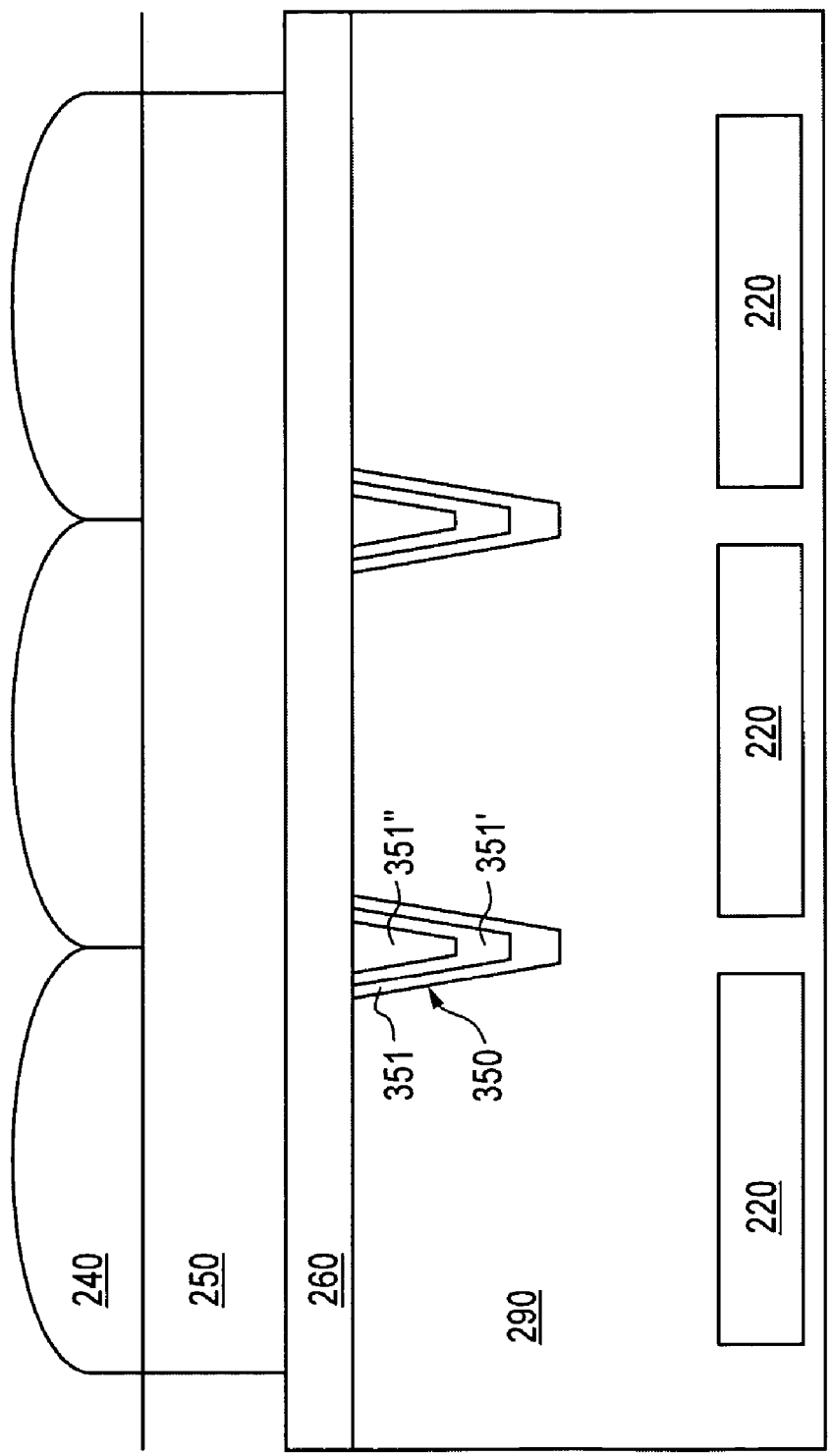
FIG. 6 shows the optical trench structure of FIG. 3 constructed in accordance with another exemplary embodiment of the invention.

FIG. 6 illustrates a fill material formed of three layers 351, 351', 351" of different materials. Every successive layer adds another barrier against optical crosstalk because any light that passes a first layer 351 can still be reflected back toward the correct photosensor by successive layers 351', 351". The number of layers and of different fill materials that may be used to fill trench 350 is in no way limited by these examples.

It should be appreciated that in the exemplary embodiments, discussed above, the trench 350 has been described as extending into the substrate 290. However, the trench 350 may be extended from or continue into additional layers of the imager. For example referring to FIG. 3, trench 350 may begin at the level of microlens layer 240, or at the level of passivation layer 260. In other words, the trench 350 may extend through any other layer included between the photosensor array 220 and the microlens layer 240. The invention may be used in solid state imagers employing various kinds of photosensors formed on a substrate in photosensor layer 220, including but not limited to photodiodes, photo transistors, photoconductors, and photogates.

In all of the described embodiments, there is a difference in refractive index between the surrounding substrate material (refractive index=n1) and the material 351 used to fill the trench 350 (refractive index=n2). If n1 is greater than n2, there is total internal reflection for large angles of incidence of the incident light 295, resulting in a considerable reduction in optical crosstalk.

In general, low dielectric constant materials will provide low refractive indexes. The various exemplary embodiments may use various materials alone (FIG. 4), or in combination (FIGS. 5, 6) as the fill material 351, 351', 351" such as those that have predominantly oxide properties such as SiO2/TEOS, Spin-cn-dielectric oxide (SOD), carbon doped silicon di-oxides, fluorinated silica glass oxide (FSG), etc. However, other commercially available materials can also be used such as SiLK, FLARE 2.0, Black Diamond Corel, PSiLK, Orion, LKD 5109 and XPX. It should be appreciated that this list of materials is in no way exhaustive of possible materials that can be used to fill the trench 350, all that is required is that the index of refraction of the trench 350 fill material 351, 351', 351" be lower than the index of refraction of the material layers surrounding the trench 350 along the optical path 223.

In another embodiment of the invention, fill materials with high light reflectivity such as metals may also be used to fill the trench 350. Some metals have a very high light reflectivity such as aluminum, copper, silver and gold, and can effectively serve as an optical barrier material. It should be appreciated that the metals mentioned are in no way an exhaustive list of possible metals which can be used; moreover, metal alloys may also be used as the fill material 351, 351', 351". The metal fill material may be one or more of fill materials 351, 351' and 351" in the trench 350, as shown in FIGS. 4-6. However, when using metals as fill materials, it is desirable to prevent the metals from diffusing into the active area of the substrate 290. This is easily achieved by forming layer 351 as a barrier layer, for example a 50 angstrom layer of silicon nitride, to prevent metal layers 351', 351" from diffusing into the substrate 290 and interfering with the operation of the pixel. In addition, one or more reflective metal layers may be used in a layer of combination within trench 350 with layers of the non-metal materials discussed above. It should be appreciated that there are likely many alternatives for materials that may be suitably employed to fill the trench 350 for integrated image sensors including metals, polymers, semiconductors, and dielectric.

Figure 7:
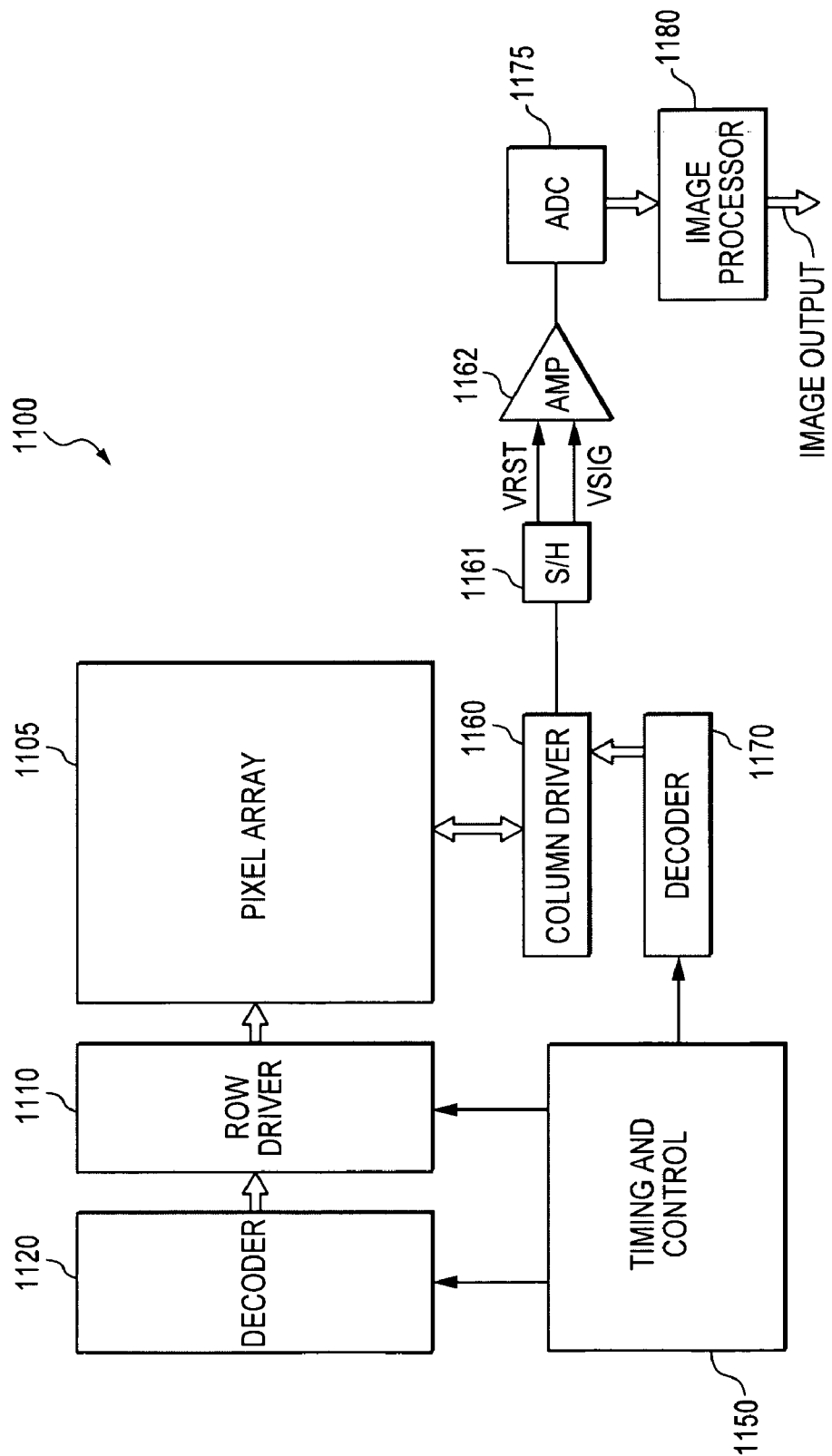
FIG. 7 shows a CMOS image sensor constructed in accordance with an embodiment of the invention.

FIG. 7 illustrates an exemplary CMOS imager 1100 that may utilize the invention. The CMOS imager 1100 has a pixel array 1105 comprising pixels constructed to include any of the overlying optical structures of the invention. The CMOS pixel array circuitry is conventional and is only briefly described herein. Row lines of the array 1105 are selectively activated by a row driver 1110 in response to row address decoder 1120. A column driver 1160 and column address decoder 1170 are also included in the imager 1100.

The imager 1100 is operated by the timing and control circuit 1150, which controls the address decoders 1120, 1170 and row driver 1110.

A sample and hold circuit 1161 associated with the column driver 1160 reads a pixel reset signal Vrst and a pixel image signal Vsig for selected pixels. A differential signal (Vrst−Vsig) is amplified by differential amplifier 1162 for each pixel and is digitized by an analog-to-digital converter 1175 (ADC). The analog-to-digital converter 1175 supplies the digitized pixel signals to an image processor 1180 which forms and outputs a digital image.

Figure 8:
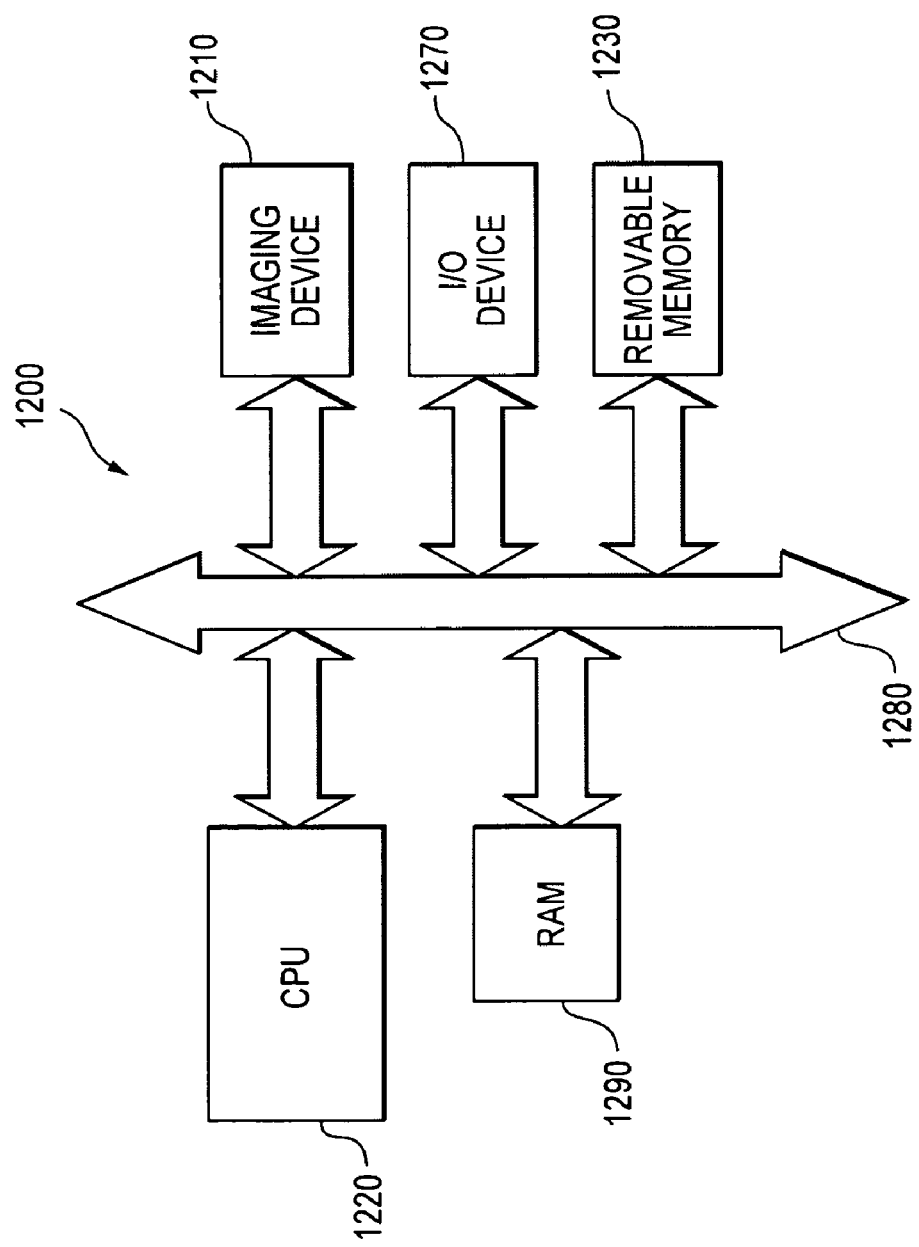
FIG. 8 shows a processor system incorporating at least one imager constructed in accordance with the exemplary embodiment of the invention.

FIG. 8 shows a system 1200, a typical processor system which includes an imaging device 1210 (such as the imaging device 1100 illustrated in FIG. 10) of the invention. The processor system 1200 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and other systems employing an imager.

System 1200, for example a camera system, generally comprises a central processing unit (CPU) 1220, such as a microprocessor, that communicates with an input/output (I/O) device 1260 over a bus 1280. Imaging device 1210 also communicates with the CPU 1220 over the bus 1280. The processor-based system 1200 also includes random access memory (RAM) 1290, and can include removable memory 1230, such as flash memory, which also communicate with the CPU 1220 over the bus 1280. The imaging device 1210 may be combined with a processor, such as a CPU, digital signal processor, or microprocessor, with or without memory storage on a single integrated circuit or on a different chip than the processor.

The above described structure, system and fabrication methods can be applied to display devices employing photoemitters as well. For example, a pixel array similar to the array 1105 of FIG. 7, but employing photoemitters rather than photosensors, may be used in a display device to reduce crosstalk and to emit a more accurate signal.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention.

What is claimed as new and desired to be protected by Letters Patent of the United States is:

1. An image pixel comprising:
   a photo-conversion device formed over a substrate;
   at least one optically transmissive layer formed over said substrate;
   a trench formed within at least a portion of said substrate and defining an optical guide structure over the photo-conversion device; and
   at least one material filling said trench, said material having a lower refractive index than a refractive index of said substrate such that said reflection is produced by a refractive index difference.

2. The pixel of claim 1, wherein said trench is continuous and surrounds a lateral area of said photo-conversion device.

3. The pixel of claim 1, wherein said at least one material has a lower refractive index than a refractive index of said substrate such that said reflection is produced by a refractive index difference.

4. The pixel of claim 1, wherein said at least one material has a dielectric constant less than 1.45.

5. The pixel of claim 1, wherein said at least one material comprises carbon doped silicon dioxide.

6. The pixel of claim 1, wherein said at least one material comprises fluorinated silica glass oxide.

7. The pixel of claim 1, wherein said at least one material comprises metal.

8. The pixel of claim 1, wherein said at least one material comprises silver.

9. The pixel of claim 1, wherein said at least one material comprises copper.

10. The pixel of claim 1, wherein said at least one material comprises a plurality of materials layered within the interior surface of said trench.

11. The pixel of claim 1, wherein an outermost layer of said plurality of materials comprises silicon nitride.

12. The pixel of claim 1, wherein said photo-conversion device is a photosensor.

13. The pixel of claim 1, wherein said photo-conversion device is a photo emitter.

14. An image sensor comprising:
a plurality of pixels in an array, at least one of said pixels comprising:
a photosensor;
a lens for receiving incident light;
at least one optically transmissive layer formed over said substrate; and
a trench formed within at least a portion of said substrate and defining an optical guide structure over the photo-conversion device; and
at least one material filling said trench, said material having a lower refractive index than a refractive index of said substrate such that said reflection is produced by a refractive index difference.

15. The image sensor of claim 14, wherein each trench is formed to surround a lateral area defined by said photosensor.

16. The image sensor of claim 14, wherein said at least one material has a lower refractive index than a refractive index of a material contained in said substrate.

17. The image sensor of claim 14, wherein said at least one material has a low-dielectric constant less than 1.45.

18. The image sensor of claim 14, wherein said at least one material comprises a metal.

19. The image sensor of claim 14, wherein said at least one material comprises a plurality of materials layered within the interior surface of said trench.

20. The image sensor of claim 19, wherein an outermost layer of said plurality of materials comprises silicon nitride.

21. A system comprising:
a processor coupled to an image sensor, said image sensor comprising:
a photosensor;
a lens for receiving incident light;
at least one optically transmissive layer formed over said substrate; and
an optical guide structure formed in said substrate, said optical guide structure comprising:
a trench defining said optical guide structure, wherein said trench surrounds a lateral area defined by said photosensor; and
at least one material filling said trench, said at least one material having a property of producing reflection of light within said optical guide structure.

22. The system of claim 21, wherein said at least one material has a lower refractive index than a refractive index of a material contained in said substrate.

23. The system of claim 21, wherein said at least one material has a low-dielectric constant less than 1.45.

24. The system of claim 21, wherein said at least one material comprises a metal.

25. The system of claim 21, wherein said at least one material comprises a plurality of materials layered within the interior surface of said trench.

26. The system of claim 25, wherein an outermost layer of said plurality of materials comprises silicon nitride.

27. A method of forming an optical guide structure within a pixel of an imaging device, comprising the steps of:
forming a photo-conversion device over a substrate;
forming at least one optically transmissive layer over said substrate;
etching a trench into at least a portion of said substrate, said trench surrounding a lateral area defined by said photo-conversion device; and
filling said trench with at least one material suitable for producing an internal reflection of light within an area defined by said trench.

28. The method of claim 27 wherein said filling step comprises coating an interior surface of said trench with a first of said at least one material, thereby producing a first partially filled trench having an interior surface.

29. The method of claim 28, wherein said filling step further comprises filling an interior surface of said partially filled trench with a second of said at least one material, said second material being different from said first material.

30. The method of claim 28, wherein said filling step further comprises:
coating an interior surface of said partially filled trench with a second of said at least one material, thereby producing a second partially filled trench having an interior surface; and
filling the interior surface of said second partially filled trench with a third of said at least one material, said third material being different from said second material.

31. The method of claim 27 wherein said at least one material has a refractive index different from a refractive index of said substrate material.

32. The method of claim 27, wherein said at least one material has a dielectric constant less than 1.45.

33. The method of claim 27, wherein said at least one material comprises carbon doped silicon dioxide.

34. The method of claim 27, wherein said at least one material comprises fluorinated silica glass oxide.

35. The method of claim 27, wherein said at least one material comprises metal.

36. The method of claim 27, wherein said at least one material comprises silver.

37. The method of claim 27, wherein said at least one material comprises copper.

* * * * *